(12) United States Patent
Zlotnik et al.

(10) Patent No.: US 11,705,173 B1
(45) Date of Patent: Jul. 18, 2023

(54) ADDRESS BITS WITH REDUCED HAMMING DISTANCE

(71) Applicant: Micron Technology, Inc., Boise, ID (US)

(72) Inventors: Leon Zlotnik, Camino, CA (US); Leonid Minz, Beer Sheva (IL)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/686,940

(22) Filed: Mar. 4, 2022

(51) Int. Cl.
| | |
|---|---|
| *G11C 8/06* | (2006.01) |
| *H03M 7/16* | (2006.01) |
| *H03M 13/15* | (2006.01) |
| *H03M 13/13* | (2006.01) |

(52) U.S. Cl.
CPC ............... *G11C 8/06* (2013.01); *H03M 7/16* (2013.01); *H03M 13/138* (2013.01); *H03M 13/1575* (2013.01)

(58) Field of Classification Search
CPC .................................. G11C 8/06; H03M 7/16
See application file for complete search history.

(56) References Cited

U.S. PATENT DOCUMENTS

| | | | |
|---|---|---|---|
| 3,430,070 A | 2/1969 | Marshall, Jr. et al. | |
| 5,179,295 A | 1/1993 | Mattison et al. | |
| 5,226,009 A | 7/1993 | Arimoto | |
| 5,392,302 A * | 2/1995 | Kemp ................ | G06F 11/1016 |
| | | | 714/E11.043 |
| 5,548,557 A * | 8/1996 | Futatsuya .............. | G11C 29/82 |
| | | | 365/201 |
| 5,767,717 A | 6/1998 | Schorn et al. | |
| 6,308,249 B1 * | 10/2001 | Okazawa ................ | G06F 12/02 |
| | | | 341/97 |
| 9,599,672 B2 | 3/2017 | Abhishek et al. | |
| 11,152,054 B2 | 10/2021 | Sun et al. | |
| 2006/0294282 A1 | 12/2006 | Warner | |
| 2011/0296134 A1* | 12/2011 | Ping ....................... | G06F 12/02 |
| | | | 711/202 |
| 2015/0055405 A1* | 2/2015 | Shiratake ............. | G11C 11/1697 |
| | | | 365/158 |

* cited by examiner

*Primary Examiner* — Joseph D Torres
(74) *Attorney, Agent, or Firm* — Brooks, Cameron & Huebsch, PLLC

(57) ABSTRACT

Memory units are accessed using address bits. The address bits used to access memory units can have various formats. The address bits to access successive locations that are to be sequentially accessed can have a reduced Hamming distance binary code format to reduce a quantity of toggling to switch from one set of address bits to another set of address bits.

18 Claims, 5 Drawing Sheets

ADDRESS BITS WITH REDUCED HAMMING DISTANCE

TECHNICAL FIELD

Embodiments of the disclosure relate generally to memory sub-systems, and more specifically, relate to address bits with reduced hamming distance.

BACKGROUND

A memory system can include control circuitry to access an array of memory cells. In general, the control circuitry uses address bits assigned to each location of the array to access.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
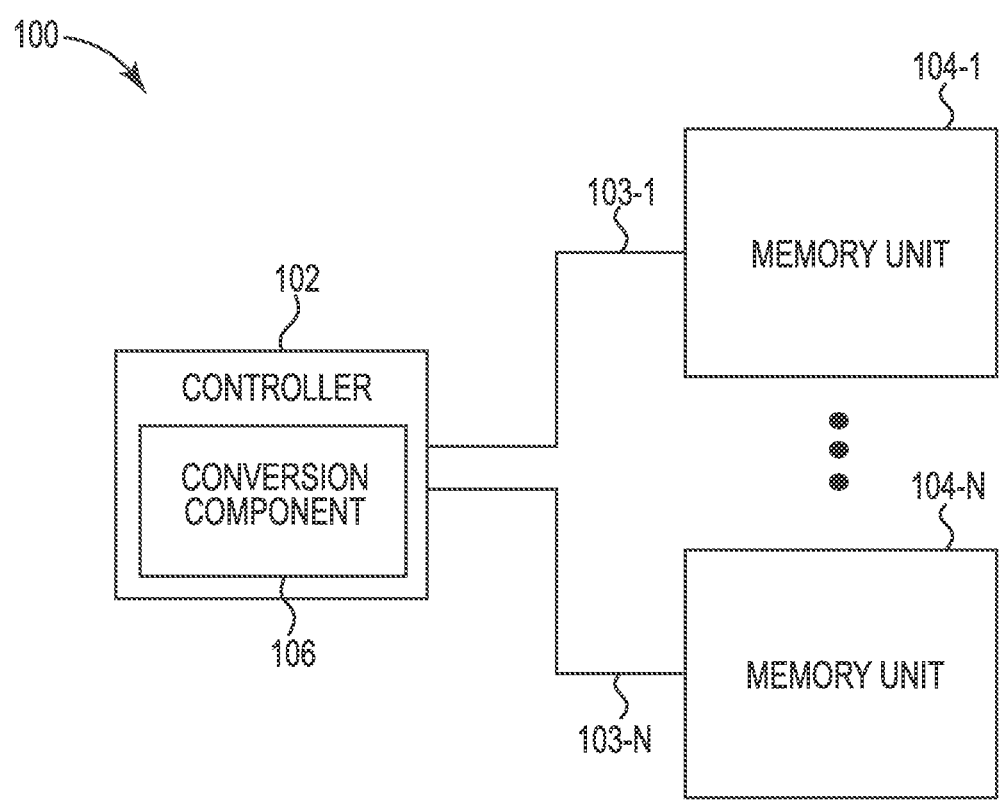
FIG. 1 illustrates an example system including a controller configured to access memory units using address bits with reduced hamming distance in accordance with a number of embodiments of the present disclosure.

Aspects of the present disclosure are directed to address bits with reduced Hamming distance. A memory can be accessed in various manners depending on how the array is addressed. In one approach, the memory can be continuously addressable such that portions (e.g., memory cells, rows of memory cells, and/or columns of memory cells) of the memory having successive addresses (e.g., consecutive physical addresses) can be sequentially accessed (e.g., in a continuous or contiguous manner). In another approach, the memory may be accessed in a non-continuous (e.g., non-continuous or non-contiguous) manner, in which portions of the memory having successive addresses are not necessarily accessed sequentially.

Accordingly, accessing the memory that is continuously addressed (e.g., sequentially addressed) can involve accessing portions of the memory whose physical addresses are sequentially assigned successive (e.g., consecutive) numerical values, which can be sequentially indicated by respective address bits. While accessing the memory, an address signal can be toggled to switch from one address bits (to access one portion of the memory) to the other address bits (to access a subsequent portion of the memory). In this approach, a quantity of toggles occurred in accessing the memory can often be based on a number of particular data values to be switched (e.g., "0" to "1" or "1" to "0") between two sets of address bits, and each toggle can incur a power consumption. Therefore, the increased quantity of toggles can undesirably increase the power consumed in accessing the memory cells.

As described in more detail herein, aspects of the present disclosure implement reduced Hamming distance binary code (e.g., binary code having a reduced Hamming distance between two consecutive values) in association with address bits and/or physical addresses assigned to portions of the memory to be sequentially accessed. In a number of embodiments of the present disclosure, address toggling (e.g., toggling an address signal to switch among sets of address bits having an reduced-distance binary code format) generally involves no more than a particular quantity of toggles (e.g., single toggle) for each switching, which can reduce the power consumed in accessing the memory cells as compared to the previous approaches, in which address bits having a natural binary code format have been used and address toggling often involves more than multiple toggles in switching between two sets of address bits.

As used herein, reduced Hamming distance binary code can be binary code having a reduced Hamming distance between two consecutive values, such as reflected binary code (RBC) code (alternative referred to as "Gray code"), Johnson ring (cyclic) code, etc., as compared to a natural binary code that is not tailored to reduce a Hamming distance. In some embodiments, the reduced Hamming distance binary code can be unit-distance binary code, such as RBC code, in which two successive binary values differ in a single bit position.

Embodiments of the present disclosure can reduce power consumption (e.g., for components operating a memory periphery), such as by 50% of the total address bus power when utilizing address bits having a reduced Hamming distance binary code format, such as an RBC format, as opposed to those approaches utilizing address bits having a natural binary code format. For example, power consumed in association with address toggling of a single port random access memory (RAM) device has been shown to be 6 to 16% of the total power consumed in operating the device, which can be reduced to 3 to 8% when address toggling with a reduced Hamming distance binary code format is implemented. Hence, implementing the address toggling of the present disclosure in operating memory devices, such as 2 port RAM device and/or True Dual Port RAM device having more addresses than a single port RAM device can further reduce the power consumption.

FIG. 1 illustrates an example system 100 including a controller 102 configured to access memory units 104-1, . . . , 104-N using address bits with reduced Hamming distance in accordance with a number of embodiments of the present disclosure. As used herein, the controller 102, or each of the memory units 104 might also be separately considered an "apparatus."

As illustrated in FIG. 1, The controller 102 can be coupled to a number of memory units 104-1, . . . , 104-N (collectively referred to as memory units 104) via a number of buses 103-1, . . . , 103-N (collectively referred to as buses 103). Each of the buses 103 can include a separate data bus (data input/output (DQ) bus), control bus, and address bus, among others. As used herein, the term "memory unit" generally refers to a memory device having one or more memory dice including one or more arrays of memory cells and/or periphery circuitries (e.g., inverters, control circuitry, etc.) to facilitate the functions to be performed by the memory device.

The controller 102 can be utilized to communicate with the memory units 104 to control access to the memory units 104 and/or to facilitate data transfer associated with the memory units 104. The controller 102 can include, for example, a number of components in the form of hardware and/or firmware (e.g., one or more integrated circuits) and/or software for controlling access to the memory units 104. In one embodiment, the controller 102 can be a system controller configured to access memory cells located on different dice. In another embodiment, the controller 102 can be an on-die controller configured to access memory cells on the same die.

Alternatively, the controller 102 can be located in a host system (e.g., a personal laptop computer, a desktop computer, a digital camera, a mobile telephone, or a memory card reader, among various other types of hosts) that can include a system motherboard and/or backplane and can include a number of memory access devices (e.g., a number of processors). In this example, the controller 102 can be coupled between a processing resource (e.g., central processing unit (CPU) of the host and a cache (and/or a content addressable memory (CAM)).

Each memory unit 104 can be continuously addressable (e.g., sequentially addressable). The memory unit 104 can include an array of memory cells that can be DRAM array, SRAM array, STT RAM array, PCRAM array, TRAM array, RRAM array, NAND flash array, and/or NOR flash array that can be continuously addressable, among other types of arrays. Although not illustrated in FIG. 1, each memory unit 104 can include memory cells arranged in rows coupled by access lines (which may be referred to herein as word lines or select lines) and columns coupled by sense lines (which may be referred to herein as data lines or digit lines). The memory unit 104 can be various types of a memory and/or memory device, such as a CAM, a cache, a buffer (e.g., an intermediate buffer between the controller 102 and a storage medium), etc.

The controller 102 can include a conversion component 106. The conversion component 106 can include hardware circuitry to perform the operations described herein, such as converting one or more address bits having one format to another. For example, the conversion component 106 can convert one or more address bit having a binary format (e.g., natural binary code format) to a reduced Hamming distance binary code format (e.g., an unit-distance binary code format, such as an RBC format). In some embodiments, the translation component 115 can include special purpose circuitry in the form of an ASIC, FPGA, state machine, and/or other logic circuitry. The address bits with the converted format can be used to access memory cells (e.g., bank 208 illustrated in FIG. 2) of one or more memory units 104.

Address bits input to the conversion component 106 can include not only a bit (e.g., one or more bits) to indicate a physical address of one location of the memory unit 104, but also other bits that are not relevant to the physical address of the memory unit 104. For example, these other bits can include one or more bits to indicate a physical address of a different location of the memory unit 104 and/or a different memory unit 104.

In some embodiments, a set of address bits input to the conversion component 106 and used to access a particular location (e.g., a bank 208 illustrated in FIG. 2) of a memory unit 104 can also include the other address bits that are not used and/or necessary in accessing the particular location. These other address bits can include those address bits that are not frequently toggled in accessing the particular location, used to access a different bank of the memory unit 108, and/or would be misleading when converted to a different format.

In one example, addresses to be sequentially accessed using address bits (having N number of bits) can be in an increment of $2^X$ such that address bits (input to the conversion component 106) with bit positions 0 to X−1 wouldn't be toggled at all during sequential accesses to the memory unit 104. As an example, consider a memory unit (e.g., the memory unit 104) having portions that are to be sequentially accessed and assigned addresses 0, 4, 8, 12, and such (in an increment of 4). Continuing with this example, each set of address bits having a natural binary code and corresponding to the addresses shown above is "0000" (corresponding to an address 0), "0100" (corresponding to an address 4), "1000" (corresponding to an address 8), "1100" (corresponding to an address 12), respectively, and in which two rightmost bits (e.g., including the least significant bit (LSB)) are not toggled and remain as "00" during the sequential accesses. In this example, accordingly, the conversion component 106 can convert a format of address bits in bit positions X to N (e.g., two leftmost bits including the most significant bit (MSB) in an example illustrated above) to a reduced Hamming distance binary code format without converting/flipping the remaining bits (such as those address bits in bit positions 0 to X−1) such that the memory unit 104 is accessed using the address bits in bit positions X to N only. This includes an exemplary scenario, in which a CPU accesses a bus having a bus width of 32 bits (4 bytes) with an address increment of 4, which does not toggle two leftmost digits including the LSB in accessing the bus.

In another example, a set of address bits received at the controller 102 and/or the conversion component 104 to access one location of a memory unit 104 can include the other address bits to access a different location of a memory unit 104. For example, the set can include a first portion of the set of address bits (e.g., including the MSB) to access a first location of the memory unit 104 as well as a second portion of the set of address bits (e.g., including the LSB) to access a second location of the memory unit 104. In this example, when accessing the first location of the memory unit 104, the conversion component 106 can convert a format of the first portion of the set to a reduced Hamming distance binary code format without converting a format of the second portion of the set, which can avoid power consumption in converting address bits that are not necessary in accessing a target location. In this event, resources of the memory system 100 can be spared by not converting these other address bits such that the other address bits can remain in a natural binary code format.

In a different example, converting N number of address bits having a natural binary code format to N number of address bits having a reduced Hamming distance binary code can lead to an access to a non-existing location of the memory unit 104, particular when a size of the memory unit 104 is not of $2^N$ (e.g., such that fewer than N number of bits can be utilized to indicate a numerical value that is less than $2^N$). In this event, the conversion component 106 can convert a number of bits fewer than N number of address bits to a reduced Hamming distance binary code format to access the memory unit 104. In an exemplary scenario, in which the memory unit (e.g., the memory unit 104) having 1536 rows is accessed using 11 address bits having a natural binary code format, only 9 out of 11 bits (which leaves two bits including the MSB in a natural binary code format) can be converted to a reduced binary code format to access the memory unit.

In a non-limiting example, an apparatus (e.g., the memory system 100, 200, and/or 300 illustrated in FIGS. 1-3) can include a memory unit (e.g., the memory unit 104 and/or 204 illustrated in FIGS. 1-2) and a controller (e.g., the controller 102, 202, and/or 302 illustrated in FIGS. 1-3) coupled to the memory unit. The controller 102 can be configured to convert an address bit having a natural binary code format (e.g., a natural binary code format) to a reduced Hamming distance binary code format (e.g., unit-distance binary code, an RBC, Johnson ring (cyclic) binary code format) and access the memory unit 104 using the address bit having the reduced Hamming distance binary code format. Although embodiments are not so limited, the memory unit 104 can be a memory that is sequentially accessible and/or addressable, such as a SRAM.

In some embodiments, locations (e.g., portions 430-1, . . . , 430-4 illustrated in FIG. 4) of the memory unit 104 that are to be sequentially accessed are assigned physical addresses of successive numerical values. Address bits having the reduced Hamming distance binary code format and corresponding to two adjacent locations of the memory unit 104 that are to be sequentially accessed have data values differing in a single bit position.

In some embodiments, the controller 102 can be configured to access a first portion of the memory unit using an address bit having the natural binary code format and access a second portion of the memory unit using an address bit having the reduced Hamming distance binary code format. In this example, the first portion of the memory unit can be a first portion of banks (e.g., the banks 208 illustrated in FIG. 2), while the second portion of the memory unit can be a second portion of banks.

Further, the controller 102 can be configured to determine whether to convert an address bit having the natural binary code format to the reduced Hamming distance binary code format prior to converting the address bit, and, in some embodiments, the controller can be configured to access the address bit having the natural binary code format without converting the address bit to the reduced Hamming distance binary code format.

Continuing with this example, the memory unit can be a first memory unit (e.g., an intermediate buffer) coupled between the controller and a second memory unit. In this example, the controller 102 can be further configured to access the second memory unit using an address bit having the reduced Hamming distance binary code format.

In another non-limiting example, an apparatus (e.g., the memory system 100, 200, and/or 300 illustrated in FIGS. 1-3) can include a memory unit (e.g., the memory unit 104 and/or 204 illustrated in FIGS. 1-2) and a controller (e.g., the controller 102, 202, and/or 302 illustrated in FIGS. 1-3) coupled to the memory unit 104. The controller 102 can be configured to convert, to access a group of memory cells (e.g., the bank 208 and/or 308 illustrated in FIGS. 2-3) having respective physical addresses of successive numerical values, a format of sets of address bits corresponding to the respective physical addresses from a natural binary code format to a reduced Hamming distance binary code format. The controller 102 can be further configured to access the group of memory cells of the memory unit 104 using the address bits having the converted format. In some embodiments, the reduced Hamming distance binary code format can be a unit-distance code format, in which data values of address bits corresponding to two successive physical addresses differ in a single bit position.

In some embodiments, the controller 102 can be configured to toggle an address signal (e.g., a bus 103 and/or 203 illustrated in FIGS. 1-2) provided to the memory unit 104 to indicate a respective set of the sets of address bits. For example, the controller 102 can be configured to toggle the address signal during a single clock cycle corresponding to a particular bit position to indicate that data values of the particular set of address bits differs from a previous set of address bits in the particular bit position.

Figure 2:
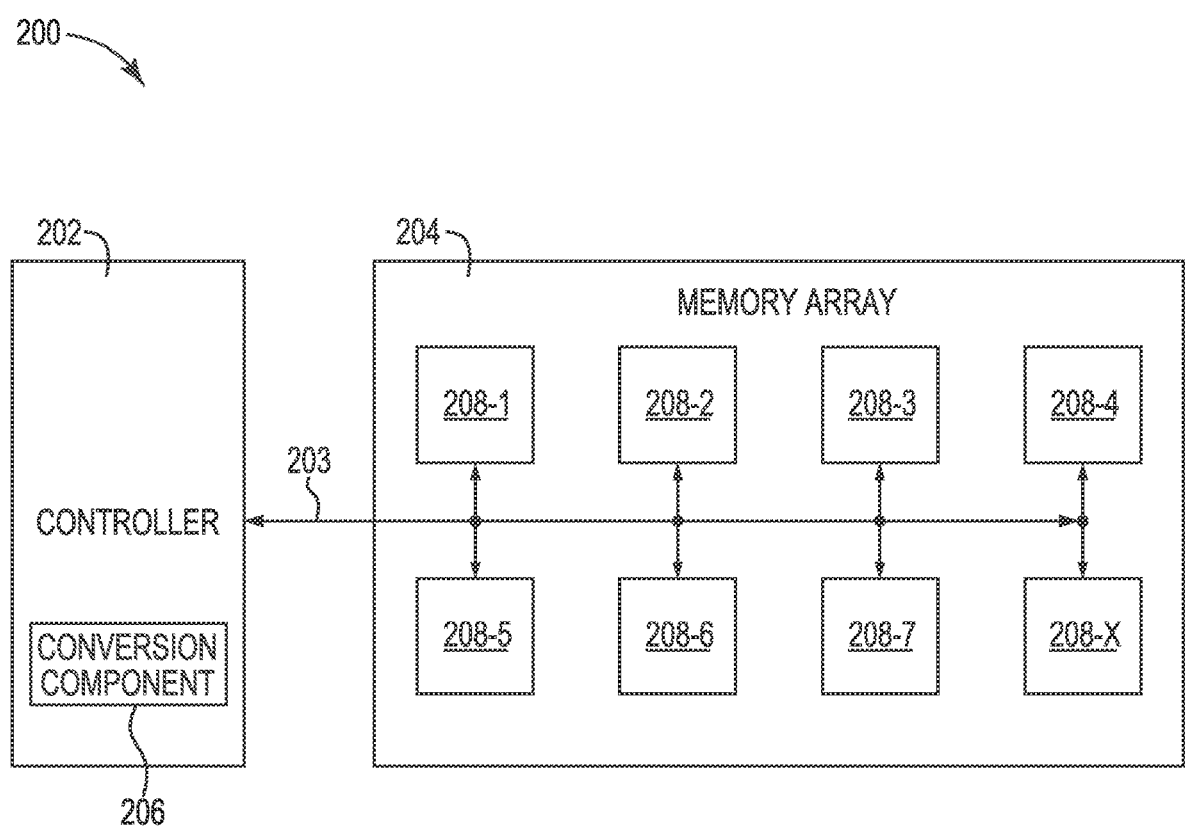
FIG. 2 illustrates an example system including a controller and a memory unit having memory banks that can be accessed using address bits with reduced hamming distance in accordance with a number of embodiments of the present disclosure.
Figure 3:
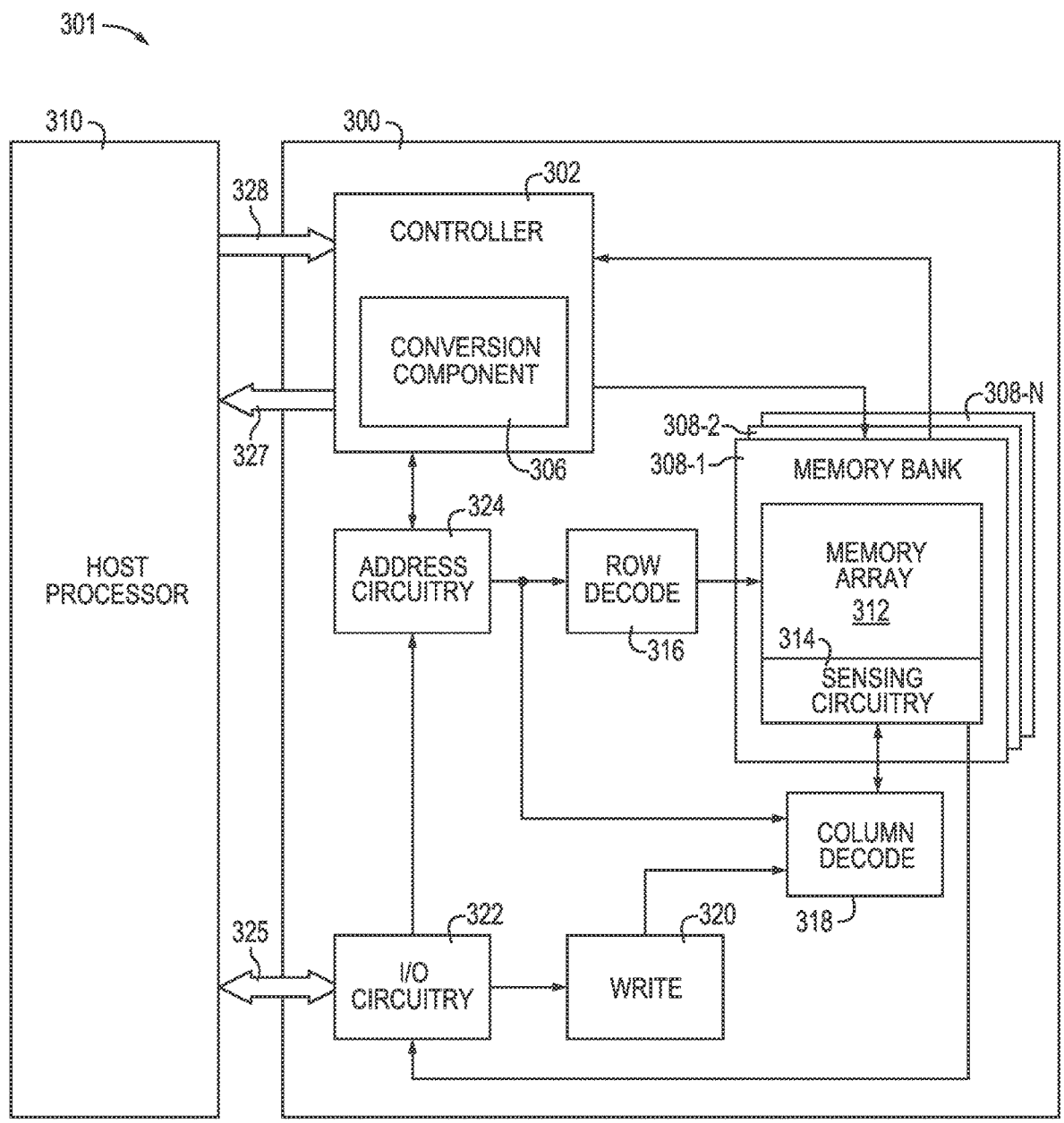
FIG. 3 illustrates a block diagram of an apparatus in the form of a computing system including a host processor and a memory system in accordance with a number of embodiments of the present disclosure.

Continuing with this example, the memory unit 104 can include a plurality of banks (e.g., the bank 208 and/or 308 illustrated in FIGS. 2-3). In this example, locations (e.g., portions 430-1, . . . , 430-4 illustrated in FIG. 4) of each bank of the plurality that are to be sequentially accessed are assigned physical addresses of successive numerical values.

FIG. 2 illustrates an example system including a controller 202 and a memory unit 204 having memory banks 208-1, . . . , 208-X that can be accessed using address bits with reduced Hamming distance in accordance with a number of embodiments of the present disclosure. The controller 202 and memory unit 204 are analogous to the controller 102 and memory unit 104 respectively as illustrated in FIG. 1. Further, although not illustrated in FIG. 2, each one of the memory banks 108 can include control circuitry (e.g., a bank processor, etc.) to control and/or orchestrate performance of memory operations in response to instructions received from the controller 202. In some embodiments, each one of the memory banks 208 can be addressed separately, for example, by the controller 202.

The controller 202 can be configured to access the memory banks 208-1, . . . , 208-X (collectively referred to as memory banks 208) via a bus 203, which can include a separate data bus (DQ bus), control bus, and address bus, among others. In some embodiments, the controller 202 can access the banks 208 simultaneously, while memory cells of each bank 208 can be sequentially accessed. Accordingly, each bank 208 can be a unit of sequential access. As further illustrated/described in connection with FIG. 4, portions (e.g., memory cells of a row or column and/or rows or columns of memory cells that are to be accessed sequentially) of each bank 208 can be assigned sequential physical addresses (e.g., 0 to 7) such that data values of address bits having a reduced Hamming distance binary code format and corresponding to two successive physical addresses differ in a single bit position. For example, 8 locations of the memory unit 204 (and/or the bank 208) that are to be sequentially accessed and having respective physical addresses of 0 to 7 can be accessed using address bits having a reduced Hamming distance binary code format (e.g., an RBC format) of "000", "001", 011", 010", 110", "111", "101", and "100", respectively. As illustrated in a Table 1 shown below, the example physical address of 0 to 7 shown above would have been corresponding to address bits of "000", "001", "010", "011", "100", "101", "110", and "111" respectively, when the address bits are in a natural binary code format.

The controller 202 can include a conversion component 206 that is analogous to the conversion component 206 illustrated in FIG. 1 to perform the operations described herein. For example, the conversion component 206 is configured to convert address bits having a natural binary code format (e.g., binary format according to a decimal counting) to a reduced Hamming distance binary code format. These address bits having a reduced Hamming distance binary code format can be used to access each memory bank 208 with single bit flipping (e.g., alternative referred to as "toggling", "toggle", and/or "bit toggling") between two successive address bits, as further illustrated/described in connection with FIG. 4. In some embodiments, the controller 202 can access banks 208 of the memory unit 204 in different manners. For example, the controller 202 can access a first set (e.g., one or more) of banks 208 using address bits having a reduced Hamming distance binary code format and access a second set (e.g., one or more) of banks 208 using address bits having a natural binary code format.

FIG. 3 illustrates a block diagram of an apparatus in the form of a computing system 301 including a host processor 310 and a memory system 300 in accordance with a number of embodiments of the present disclosure. As used herein, a memory system 300, a controller 302, memory banks 308-1, 308-2, ..., 308-N, and/or memory array 312 might also be separately considered an "apparatus."

The computing system 301 can be a host system such as a personal laptop computer, a desktop computer, a digital camera, a smart phone, a memory card reader, and/or internet-of-things (IOT) enabled device, among various other types of hosts. The host can include a system motherboard and/or backplane and can include a number of processing resources (e.g., one or more processors, microprocessors, or some other type of controlling circuitry).

The host processor 310 can one or more processing components, such as CPU, arithmetic unit (ALU), graphics processing unit (GPU), etc. The memory system 300 can include a number of memory banks 308-1, 308-2, ..., 308-N (e.g., collectively referred to as memory banks 308) that can include a memory array 312 including multiple rows and columns of storage units and sensing circuitry 314. The memory banks 308 can be in a single memory unit and/or distributed over different memory units (e.g., the memory unit 104 and/or 204 illustrated in FIGS. 1-2, respectively). Although not illustrated in FIG. 3, each one of the memory banks 308 can include control circuitry (e.g., a bank processor) to control and/or orchestrate performance of memory operations in response to instructions received from the controller 302. In some embodiments, each one of the memory banks 308 can be addressed separately, for example, by the controller 302.

Although embodiments are not so limited, the memory array 312 can be a sequentially addressable, continuously addressable, and/or accessible memory, such as an array of be DRAM array, SRAM array, STT RAM array, PCRAM array, TRAM array, RRAM array, NAND flash array, and/or NOR flash array, among other types of arrays. The array 312 can include memory cells arranged in rows coupled by access and columns coupled by sense lines.

As shown in FIG. 3, the memory system 300 can include address circuitry 324 to latch address signals provided over a combined data/address bus 325 (e.g., an external I/O bus connected to the host processor 310) by I/O circuitry 322, which can include an internal I/O bus. The internal I/O bus can transfer data between memory banks and I/O pins (e.g., SRAM DQs), for example. Status and/or exception information can be provided from the controller 102 on the memory system 100 to host 310 through an interface, such an output (e.g., out-of-band) bus 327.

The memory system 300 can include address circuitry 324 to latch address signals for data provided over an input/output "I/O" bus 325 (e.g., data bus and/or address bus) through I/O circuitry 322 (e.g., provided to external ALU circuitry and to SRAM DQs via local I/O lines and global I/O lines). Address signals are received through address circuitry 324 and decoded by a row decoder 316 and a column decoder 318 to access the memory array 312. Data can be read from the memory array 312 by sensing voltage and/or current changes on sense lines (digit lines) using the sensing circuitry 314. The sensing circuitry 314 can read and latch a page (e.g., row) of data from the memory array 312. The I/O circuitry 322 can be used for bi-directional data communication with system controller 310 over the data bus 325 (e.g., a 64 bit wide data bus). The write circuitry 320 can be used to write data to the memory array 312.

The controller 302 (e.g., bank control logic and sequencer) can decode signals (e.g., commands) provided by control bus 328 from the host processor 310. These signals can include chip enable signals, write enable signals, and/or address latch signals that can be used to control operations performed on the memory array 312, including data sense, data store, data movement (e.g., copying, transferring, and/or transporting data values), data write, and/or data erase operations, among other operations. In various embodiments, the controller 302 can be responsible for executing instructions from the system controller 310 and accessing the memory array 312. The controller 302 can be a state machine, a sequencer, or some other type of controller.

Further, the controller 302 can include a conversion component 306 that is analogous to the conversion component 306 illustrated in FIG. 1 and perform the operations described herein. For example, the conversion component 306 is configured to convert address bits having a natural binary code format (e.g., binary format according to a decimal counting) to a reduced Hamming distance binary code format. These address bits having a reduced Hamming distance binary code format can be used to access each memory bank 308 with single bit flipping for between two successive address bits, as further illustrated/described in connection with FIG. 4. The address bits having a natural binary code format and input to the conversion component 306 can be received from the host processor 310 (e.g., as part of a host command received from the host processor 310 to access the memory unit 104/204 and/or memory banks 208/308). In some embodiments, the address bits received from the host processor 310 can be logical addresses, which can be translated into physical addresses (having a natural binary code format) of the memory unit 104/204 and/or memory banks 208/308 prior to being input to the conversion component 306.

Figure 4:
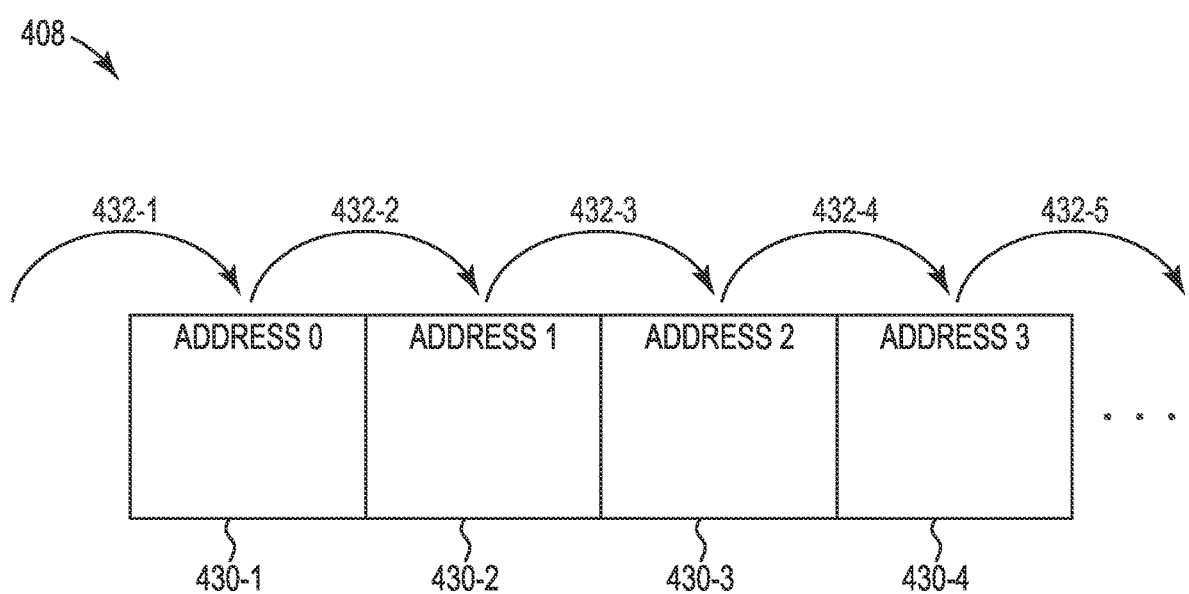
FIG. 4 illustrates an example sequential access to memory cells of a memory bank using address bits with reduced hamming distance in accordance with a number of embodiments of the present disclosure.

FIG. 4 illustrates an example sequential access to memory cells of a memory bank 408 using address bits with reduced Hamming distance in accordance with a number of embodiments of the present disclosure. The memory bank 408 is analogous to the memory bank 208 illustrated in FIG. 2. As illustrated in, the memory bank 408 is illustrated as having at least four portions 430-1, 430-2, 430-3, and 430-4 (collectively referred to as portions 430), although embodiments are not limited to a particular quantity of portions of the memory bank. For the sake of illustration, however, the four portions 430 shown in FIG. 4 can correspond to memory cells of a row and/or a column of the memory bank 408 (e.g., each portion 430 is a memory cell) or rows and/or columns of memory cells (e.g., each portion 430 is a row and/or a column of the memory bank 408) that are continuously/contiguously addressed and to be sequentially accessed using different address bits.

Each portion 430 can be continuously/contiguously addressed (e.g., sequentially assigned successive physical addresses). For example, the portion 430-1 is assigned a physical address "0"; the portion 430-1 is assigned a physical address "1"; the portion 430-1 is assigned a physical address "2"; and the portion 430-1 is assigned a physical address "3", as illustrated in FIG. 4. As described above, portions of the memory bank 408 can be sequentially accessed. For example, the portions 430 can be accessed in an order of portions 430-1, 430-2, 430-3, and 430-4, as respectively illustrated by sequential accesses 432-1, 432-2, 432-3, 432-4, and 432-5.

The sequential accesses 432-1, 432-2, 432-3, 432-4, and 432-5 can be performed using sets of address bits having a reduced Hamming distance binary code format, such as an RBC format. In an example scenario, these address bits corresponding to the addresses "0", "1", "2", "3" can be "0000", "0001", "0011", and "0010", respectively. In this example, accordingly, the sequential access 432-1 is performed using the address bits "0000". Subsequent to the sequential access 432-1, the sequential access 432-2 is performed using the address bits "0001". Since the only difference between "0000" and "0001" is on a fourth bit (alternatively referred to as the least significant bit (LSB)), a controller (e.g., the controller 102 illustrated in FIG. 1) toggles an address signal (e.g., provided via the bus 103 illustrated in FIG. 1) to flip the fourth bit to perform the sequential access 432-2 and access the portion 430-2. Similarly, the controller toggles the address signal to flip the third bit (e.g., "0001" to "0011") to perform the sequential access 432-3 and access the portion 430-3 subsequent to the sequential access 432-2, and toggles the address signal to flip the fourth bit (e.g., "0011" to "0010") to perform the sequential access 432-4 and access the portion 430-3 subsequent to the sequential access 432-2. Accordingly, throughout the sequential access of the memory bank 408, switching between different physical addresses involves only a single toggling and/or a single bit flipping.

In some embodiments, the portions 430 can be accessed using address bits having a natural binary code format (e.g., binary format according to a decimal counting). In an exemplary scenario, these address bits can correspond to the addresses "0", "1", "2", "3" can be "0000", "0001", "0010", and "0011", respectively. In this example, switching from the address "1" to "2" (for the sequential access 432-2) involves switching from the address bits "0001" to "0010", which further involves toggling two bits (e.g., flipping a third bit from "0" to "1" and a fourth bit from "1" to "0") instead of a single bit.

In an exemplary scenario, 8 sequential accesses can be performed using (e.g., 3-bit) address bits having an RBC or a natural binary code format as follows:

TABLE 1

|  | RBC | Natural Binary Code |
| --- | --- | --- |
| 1st access | 000 | 000 |
| 2nd access | 001 | 001 |
| 3rd access | 011 | 010 |
| 4th access | 010 | 011 |
| 5th access | 110 | 100 |
| 6th access | 111 | 101 |
| 7th access | 101 | 110 |
| 8th access | 100 | 111 |

As illustrated in Table 1, these eight accesses using address bits having a natural binary code format involves eight toggles on a bit position 0 (e.g., the least significant bit (LSB)) (e.g., to program a bit position 0 to "0" for $1^{st}$ access and switching from "0" to "1" or "1" to "0" over 7 subsequent accesses), four toggles on a bit position 1 (e.g., to program a bit position 1 to "0" for $1^{st}$ access and switching from "0" to "1" between $2^{nd}$ and $3^{rd}$ accesses and $6^{th}$ and $7^{th}$ accesses), and two toggles on a bit position 2 (e.g., the most significant bit (MSB)) (e.g., to program a bit position 2 to "0" for $1^{st}$ access and switching from "0" to "1" between $4^{th}$ and $5^{th}$ accesses). Alternatively, the same eight accesses but using address bits having an RBC format total eight toggles since switching between any two accesses involves only a single toggle. Therefore, power consumption associated with address toggling using an RBC format can be reduced by 6/14 as compared to that using a natural binary code format. Accordingly, these (e.g., at least) 8 sets of address bits having a natural binary code format can be input to the conversion component 106, 206, and/or 306 illustrated in FIGS. 1 to 3 can be converted to those 8 sets of address bits having a reduced Hamming distance binary code format, such as an RBC format for the sequential accesses 432 to the portions 430.

In another exemplary scenario, a number of sequential accesses (at least 8 sequential access) can be performed using (e.g., 4-bit) address bits having an RBC or a natural binary code format as follows:

TABLE 2

|  | RBC | Natural Binary Code |
| --- | --- | --- |
| 1st access | 0000 | 0000 |
| 2nd access | 0001 | 0001 |
| 3rd access | 0011 | 0010 |
| 4th access | 0010 | 0011 |
| 5th access | 0110 | 0100 |
| 6th access | 0111 | 0101 |
| 7th access | 0101 | 0110 |
| 8th access | 0100 | 0111 |

As illustrated in Table 2, these eight accesses using address bits having a natural binary code format involves eight toggles on a bit position 0 (e.g., the least significant bit (LSB)) (e.g., to program a bit position 0 to "0" for $1^{st}$ access and switching from "0" to "1" or "1" to "0" over 7 subsequent accesses), four toggles on a bit position 1 (e.g., to program a bit position 1 to "0" for $1^{st}$ access and switching from "0" to "1" between $2^{nd}$ and $3^{rd}$ accesses and $6^{th}$ and $7^{th}$ accesses), and two toggles on a bit position 2 (e.g., the most significant bit (MSB)) (e.g., to program a bit position 2 to "0" for $1^{st}$ access and switching from "0" to "1" between $4^{th}$ and $5^{th}$ accesses). Alternatively, the same eight accesses but using address bits having an RBC format total eight toggles since switching between any two accesses involves only a single toggle. Accordingly, these (e.g., at least) 8 sets of address bits having a natural binary code format can be input to the conversion component 106, 206, and/or 306 illustrated in FIGS. 1 to 3 can be converted to those 8 sets of address bits having a reduced Hamming distance binary code format, such as an RBC format for the sequential accesses 432 to the portions 430.

In some embodiments, converting to a reduced Hamming distance binary code format can include more bit flipping on the LSB than on the MSB. This can consume less power than including more bit flipping on the MSB in the event that sequential accesses involve bit flipping on the LSB more frequently than on the MSB. Accordingly, converting to a reduced Hamming distance binary code format with more bit flipping on the MSB may weaken the benefits of utilizing a reduced Hamming distance binary code format in performing sequential accesses.

In some embodiments, the sequential accesses 432 can be performed without converting address bits to a reduced Hamming distance binary code format, which can be determined based on whether converting to a reduced Hamming distance binary code format (and performing the sequential accesses using the converted format) would consume more power than performing the sequential accesses using a natural binary code format (without converting to a reduced Hamming distance binary code format and rather than utilizing extra logic gates of the conversion component 106, 206, and/or 306 to convert a format). Accordingly, the conversion component 106, 206, and/or 306 can determine (prior to converting a format) whether it would be beneficial to convert a format of address bits and access the memory unit 108 and/or 208 using the converted format based on, for example, a comparison of a number of address bits to be flipped in converting the format and a number of bits to be toggled during the sequential accesses (e.g., the sequential accesses 432).

Figure 5:
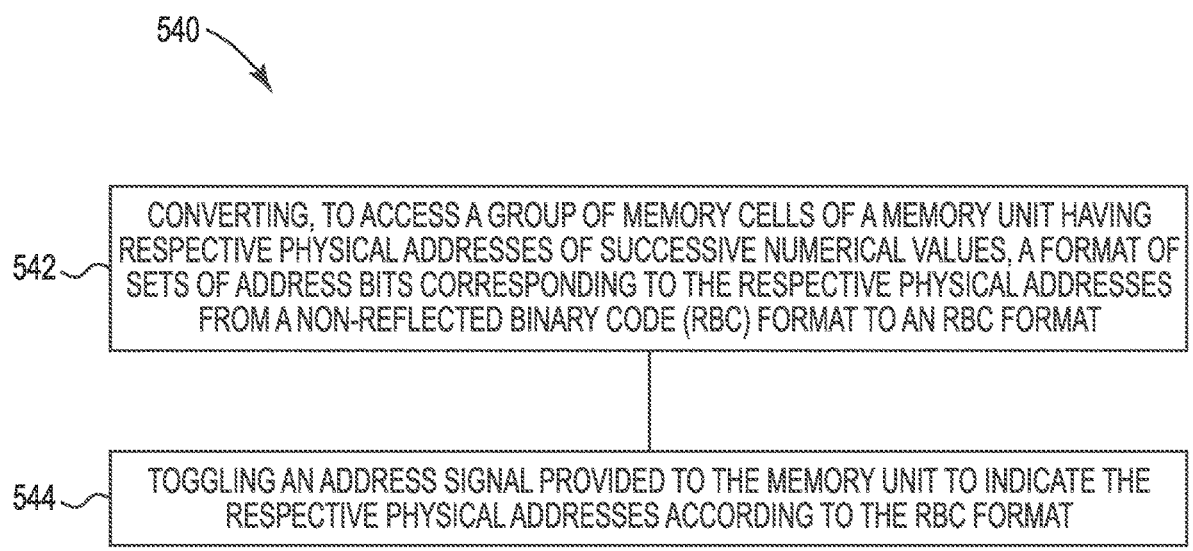
FIG. 5 is a flow diagram corresponding to a method for accessing memory cells using address bits with reduced Hamming distance in accordance with some embodiments of the present disclosure.

FIG. 5 is a flow diagram corresponding to a method 540 for address bits with reduced Hamming distance in accordance with some embodiments of the present disclosure. The method 540 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 540 is performed by one or more components of the controller 102, 202, and 302 of FIGS. 1-3. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 542, a format of sets of address bits corresponding to the respective physical addresses can be converted from a natural binary code format to a reduced Hamming distance binary code format to access a group of memory cells of a memory having respective physical addresses of successive numerical values. In some embodiments, a format of a first portion of each set of address bits can be converted to the reduced Hamming distance binary code format, while a second portion of each set of address bits is still in the natural binary code format even subsequent to the conversion. In this example, the memory unit can be accessed using the first portion of each set of address bits having the reduced Hamming distance binary code format (e.g., without utilizing the second portion of each set of address bits).

At operation 544, an address signal provided to the memory can be toggled to indicate the respective physical addresses according to the reduced Hamming distance binary code format. In some embodiments, the address signal can be toggled to indicate a flipped bit between sets of address bits of two successive physical addresses of the group of memory cells. In some embodiments, the address signal can be toggled to indicate a first set of the sets of address bits. The address signal can be toggled during a particular clock cycle to indicate a second set of the sets of address bits whose data values differ from those of the first set in a bit position corresponding to the particular clock cycle.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus, comprising:
a memory unit; and
a controller coupled to the memory unit, the controller configured to:
convert a sets of physical address bits having a natural binary code format to a reduced Hamming distance binary code format;
access a first portion of the memory unit using a first set of physical address bits having the natural binary code format; and
access a second portion of the memory unit using a second set of physical address bits having the reduced Hamming distance binary code format, wherein the reduced Hamming distance binary code format involves a reduced number of toggles in accessing the memory unit than using the natural binary code format.

2. The apparatus of claim 1, wherein locations of the memory unit that are to be sequentially accessed are assigned physical addresses of successive numerical values.

3. The apparatus of claim 1, wherein the second sets of physical address bits having the reduced Hamming distance binary code format corresponds to two adjacent locations of the memory unit that are to be sequentially accessed have data values differing in a single bit position.

4. The apparatus of claim 1, wherein the memory unit comprises a plurality of banks, and the first portion of the memory unit corresponds to a first portion of the plurality of banks and the second portion of the memory unit corresponds to a second portion of the plurality of banks.

5. The apparatus of claim 1, wherein the memory unit is a first memory unit coupled between the controller and a second memory unit, wherein the controller is further configured to access the second memory unit using a set of physical address bits having the reduced Hamming distance binary code format.

6. The apparatus of claim 1, wherein the reduced Hamming distance binary code format is a reflected binary code (RBC) format.

7. The apparatus of claim 1, wherein the reduced Hamming distance binary code format is a Johnson ring binary code format.

8. An apparatus, comprising:
a memory unit; and
a controller coupled to the memory unit, the controller configured to:
convert, to access a first group of memory cells of the memory unit and having respective physical addresses of successive numerical values, a format of sets of address bits corresponding to the respective physical addresses from a natural binary code format to a reduced Hamming distance binary code format;
access the first group of memory cells of the memory unit using the address bits having the converted format; and
access a second group of memory cells of the memory unit using a second set of physical address bits having the natural binary code format.

9. The apparatus of claim 8, wherein the first group of memory cells and the second group of memory cells correspond respective banks of the memory unit.

10. The apparatus of claim 8, wherein data values of address bits corresponding to two successive physical addresses differ in a single bit position.

11. The apparatus of claim 8, wherein the controller is configured to toggle an address signal provided to the memory unit to indicate a respective set of the sets of address bits.

12. The apparatus of claim 11, wherein the controller is configured to, to indicate a particular set of address bits corresponding to one of the respective physical addresses:
toggle the address signal during a single clock cycle corresponding to a particular bit position to indicate that data values of the particular set of address bits differs from a previous set of address bits in the particular bit position.

13. The apparatus of claim 8, wherein the reduced Hamming distance binary code format is a unit-distance code format.

14. The apparatus of claim 8, wherein the memory unit comprises a plurality of banks, and wherein memory cells of each bank of the plurality that are to be sequentially accessed are assigned physical addresses of successive numerical values.

15. A method, comprising:
converting, to access a first group of memory cells of a memory unit having respective physical addresses of successive numerical values, a format of sets of address bits corresponding to the respective physical addresses from a natural binary code format to a reduced Hamming distance binary code format;
accessing the first group of memory cells using the sets of address bits having the reduced Hamming distance binary code format; and
accessing a second portion of the memory unit using different sets of physical address bits having the natural binary code format.

16. The method of claim 15, further comprising:
toggling an address signal provided to the memory unit to indicate the respective physical addresses according to the reduced Hamming distance binary code format;
wherein toggling the address signal provided to the memory unit to indicate the respective physical addresses according to the reduced Hamming distance binary code format further comprises toggling the address signal to indicate a flipped bit between sets of address bits of two successive physical addresses of the first group of memory cells.

17. The method of claim 16, further comprising toggling the address signal provided to the memory unit to indicate the respective physical addresses according to the reduced Hamming distance binary code format further comprises:
toggling the address signal provided to the memory unit to indicate a first set of the sets of address bits; and
toggling the address signal provided to the memory unit during a particular clock cycle to indicate a second set of the sets of address bits, wherein data values of the second set of address bits differ from those of the first set in a bit position corresponding to the particular clock cycle.

18. The method of claim 15, further comprising:
converting a format of a first portion of each set of address bits to the reduced Hamming distance binary code format, while a second portion of each set of address bits is still in the natural binary code format even subsequent to the conversion; and
accessing the memory unit using the first portion of each set of address bits having the reduced Hamming distance binary code format.

* * * * *